United States Patent
Fritsche et al.

(10) Patent No.: US 11,848,541 B2
(45) Date of Patent: Dec. 19, 2023

(54) SPECTRAL BEAM COMBINER WITH INDEPENDENT WAVELENGTH STABILIZATION

(71) Applicant: II-VI Delaware, Inc., Wilmington, DE (US)

(72) Inventors: Haro Fritsche, Berlin (DE); Andreas Grohe, Berlin (DE)

(73) Assignee: II-VI Delaware, Inc., Wilmington, DE (US)

( * ) Notice: Subject to any disclaimer, the term of this patent is extended or adjusted under 35 U.S.C. 154(b) by 397 days.

(21) Appl. No.: 17/121,837

(22) Filed: Dec. 15, 2020

(65) Prior Publication Data

US 2022/0190561 A1  Jun. 16, 2022

(51) Int. Cl.
| | | |
|---|---|---|
| *H01S 5/40* | (2006.01) | |
| *G02B 27/10* | (2006.01) | |
| *G02B 27/09* | (2006.01) | |

(52) U.S. Cl.
CPC ........ *H01S 5/4012* (2013.01); *G02B 27/0905* (2013.01); *G02B 27/0944* (2013.01); *G02B 27/1006* (2013.01); *H01S 5/4087* (2013.01)

(58) Field of Classification Search
CPC ...... H01S 5/4012; H01S 5/4087; H01S 5/141; H01S 3/0805; H01S 3/0816; H01S 5/4062; G02B 27/0905; G02B 27/0944; G02B 27/1006
See application file for complete search history.

(56) References Cited

U.S. PATENT DOCUMENTS

| | | |
|---|---|---|
| 5,386,426 A | 1/1995 | Stephens |
| 5,537,432 A | 7/1996 | Mehuys et al. |
| 6,914,917 B2 | 7/2005 | Pilgrim et al. |
| 6,941,043 B1 | 9/2005 | Major et al. |
| 7,012,939 B2 | 3/2006 | Choi et al. |
| 7,199,924 B1 | 4/2007 | Brown et al. |
| 7,245,642 B1 | 7/2007 | Pilgrim et al. |

(Continued)

FOREIGN PATENT DOCUMENTS

WO    WO 2019/205500    10/2019

OTHER PUBLICATIONS

Sanchez-Rubio, Antonio et al., "Wavelength Beam Combining for Power and Brightness Scaling of Laser Systems", Lincoln Laboratory Journal, vol. 20, No. 2, 2014, pp. 52-66.

(Continued)

*Primary Examiner* — Xinning(Tom) Niu
(74) *Attorney, Agent, or Firm* — Wendy W. Koba

(57) ABSTRACT

A spectral beam combiner is based upon a specialized diffraction grating that is intentionally configured to create output signals along two separate paths, each path supporting a spectrally-combined beam. One path supports the propagation of a majority of the spectrally-combined beam (e.g., 80-95%) and is defined as the output path from the beam combiner. The remainder of the spectrally-combined beam is directed along a separate path and into an external cavity arrangement used to perform wavelength stabilization. Either reflective or transmissive diffraction gratings may be used, with different diffraction orders and/or polarization states of the spectrally-combined optical beam used to create the output beam and the separate wavelength stabilization feedback beam.

14 Claims, 5 Drawing Sheets

(56) References Cited

U.S. PATENT DOCUMENTS

| | | |
|---|---|---|
| 8,531,772 B2 | 9/2013 | Chann et al. |
| 9,104,029 B2 | 8/2015 | Tayebati et al. |
| 9,256,073 B2 | 2/2016 | Chann et al. |
| 9,391,713 B2* | 7/2016 | Zimer ................. H04B 10/572 |
| 9,568,640 B2 | 2/2017 | Csutak et al. |
| 9,577,409 B1 | 2/2017 | Connolly et al. |
| 9,905,993 B2 | 2/2018 | Huber et al. |
| 9,991,678 B1 | 6/2018 | Thielen et al. |
| 10,320,148 B2 | 6/2019 | Fritsche et al. |
| 10,333,265 B2* | 6/2019 | Tong .................... H01S 5/4012 |
| 2002/0090017 A1 | 7/2002 | Hagberg et al. |
| 2004/0101319 A1 | 5/2004 | Choi et al. |
| 2005/0190809 A1 | 9/2005 | Petersen et al. |
| 2008/0298402 A1 | 12/2008 | Rossi et al. |
| 2011/0216417 A1* | 9/2011 | Chann ................ G02B 19/0028 359/615 |
| 2011/0216792 A1* | 9/2011 | Chann .................... H01S 5/405 372/31 |
| 2011/0280264 A1* | 11/2011 | Yamazoe ............ H01S 3/08045 372/19 |
| 2013/0028276 A1* | 1/2013 | Minelly .............. H01S 3/06704 372/6 |
| 2015/0229099 A1* | 8/2015 | Tayebati ............... H01S 5/0687 372/32 |
| 2017/0082863 A1 | 3/2017 | Marciante |
| 2018/0097334 A1* | 4/2018 | Chann .................. H01S 5/3401 |
| 2018/0205197 A1 | 7/2018 | Zimer et al. |
| 2020/0067277 A1 | 2/2020 | Kaneda |
| 2020/0174265 A1 | 6/2020 | Nguyen et al. |

OTHER PUBLICATIONS

Saliba, Sebastian et al., "Mode Stability of External Cavity Diode Lasers", Applied Optics/vol. 48, No. 35/Dec. 10, 2009, pp. 6692-6700.

Baillard, X. et al., "Interference-filter-stablized External-cavity Diode Lasers", Preprint submitted to Optics Communications ,Feb. 2, 2008, pp. 1-12.

* cited by examiner

SPECTRAL BEAM COMBINER WITH INDEPENDENT WAVELENGTH STABILIZATION

TECHNICAL FIELD

The present invention relates to spectral beam combiners, used in systems requiring high-power or high-brightness optical output beams and, more particularly, to a configuration that includes a wavelength stabilization feedback path separate from the high-power/brightness output path.

BACKGROUND OF THE INVENTION

Laser diode arrays are often used as a source for high power, high brightness applications, where the individual beams emitted from an array are combined to form the output beam. Spectral beam combining is a particular technique where individual laser beams operating at different wavelengths are superimposed (combined) via a diffraction grating to form a single, multi-wavelength beam. The ability to perform this type of wavelength-dependent combining of independent beams requires that each laser diode source exhibit a relatively high level of stability, since drifts in emission wavelength result in de-focusing the diffracted output and reducing the generated output power.

According to the state of the art, the wavelengths can be limited and stabilized by means of internal or external wavelength-selective elements or structures. An external type of stabilization is achieved as a result of spectrally selective feedback of the emitted radiation back into the diode laser. An example is a so-called external cavity diode laser (ECDL) array where feedback is provided by means of spectrally-selective reflection.

One drawback to the use of a diffraction grating in such an arrangement is that the output signal path and the feedback path are coincident and are thus mutually dependent. However, wavelength stabilization is best performed in an arrangement exhibiting a relatively long cavity length, while coupling maximum optical power into a signal path (such as an optical fiber, waveguide, or the like) favors as short an external cavity as possible.

SUMMARY OF THE INVENTION

The present invention addresses limitations of prior art spectral beam combiners by utilizing separate wavelength stabilization and output signal paths, providing independent control and optimization of both the output signal path and the wavelength stabilization functionality.

In accordance with the principles of the present invention, a diffraction grating included in a spectral beam combiner is intentionally configured to create output signals along two separate paths, each path supporting a spectrally-combined beam. One path supports the propagation of a majority of the spectrally-combined beam (e.g., 80-95%) and is defined as the output path from the beam combiner. The remainder of the spectrally-combined beam is directed along a separate path and into an external cavity arrangement used to perform wavelength stabilization. Either reflective or transmissive diffraction gratings may be used, with different diffraction orders or polarization states of the spectrally-combined optical beam used to create the output beam and the separate wavelength stabilization feedback beam.

An exemplary embodiment may take the form of a spectral beam combiner for use with a plurality of individual laser beam sources, each emitting a beam at a different wavelength to create a plurality of laser beams. The spectral beam combiner includes a diffraction grating disposed to intercept the plurality of laser beams, where the diffraction grating is configured to direct a majority of the optical power of each beam into a defined first diffraction order (to form a spectrally-combined, high-power optical output beam) and direct a residual optical power of each beam into a defined second diffraction order to form a spectrally-combined, low-power beam. A wavelength stabilization optics arrangement is included the beam combiner and is disposed to intercept the spectrally-combined, low-power beam. The wavelength stabilization optics arrangement itself includes a turning mirror positioned to intercept spectrally-combined, low-power beam and re-direct the low-power beam along a stabilization path and a high-reflectivity (HR) mirror disposed along the stabilization path at a spaced-apart distance L from the turning mirror, the spaced-apart distance L selected to form a resonant cavity with the plurality of individual laser beam sources and provide wavelength stability for the plurality of laser beams.

Other and further embodiments and advantages of the present invention will become apparent during the course of the following discussion and by reference to the accompanying drawings.

BRIEF DESCRIPTION OF THE DRAWINGS

Referring now to the drawings, where like numerals represent like parts in several views.

DETAILED DESCRIPTION

Figure 1:
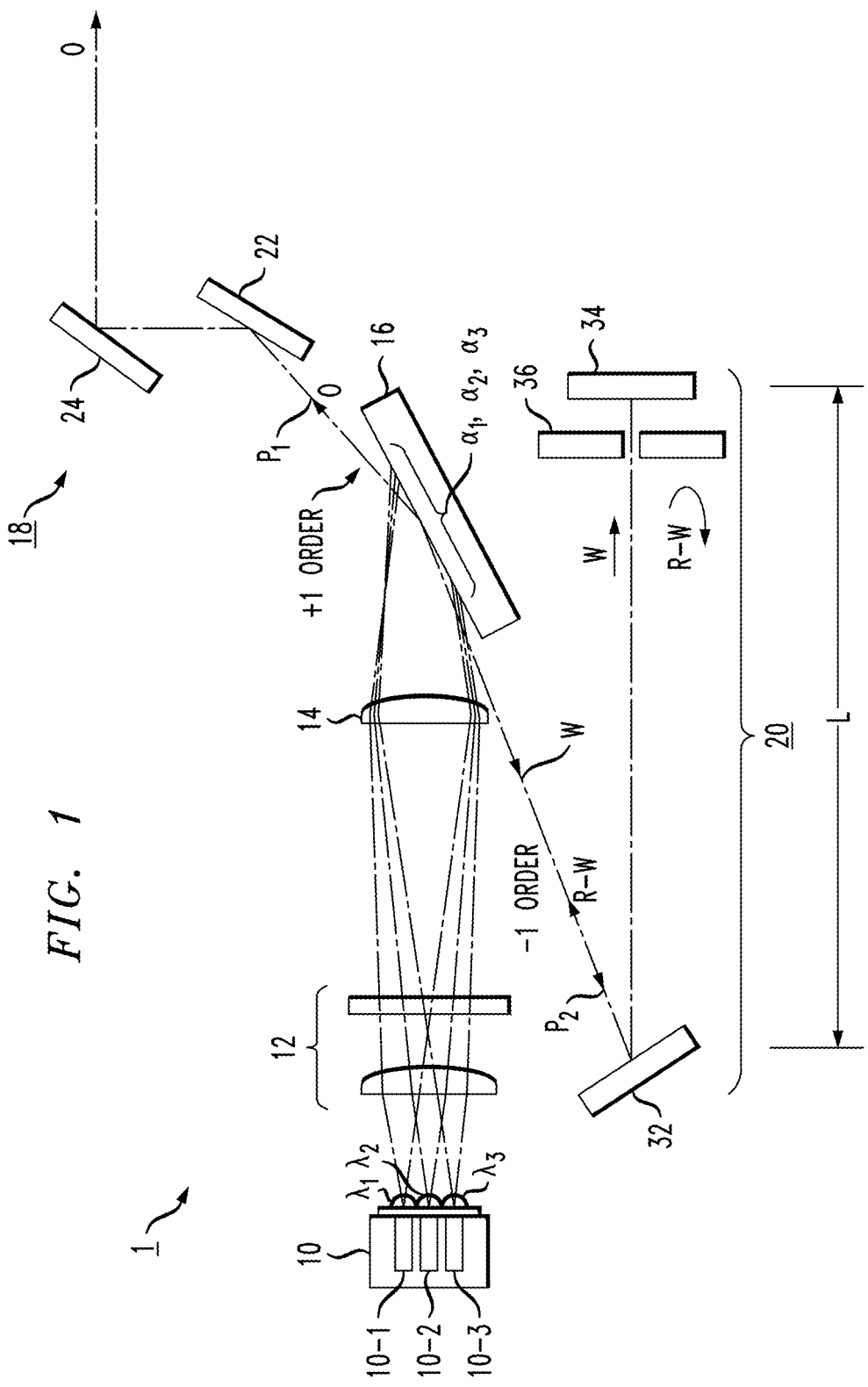
FIG. 1 is a diagram of an exemplary spectral beam combiner formed in accordance with the principles of the present invention to include separate optical paths for the high-power output beam and a wavelength-stabilization feedback beam.

FIG. 1 illustrates a spectral beam combiner 1 for a high-power laser system formed in accordance with the principles of the present invention to include a wavelength stabilization path separate from the main high-power output optical signal path. In this manner, the optical properties of wavelength stabilization (e.g., path length, reflectivity, spatial filtering) are able to be optimized to maintain the stability required for optimum spectral overlap along the main output signal path. In turn, the optical properties of the output path (e.g., path length, coupling optics, etc.) can be independently optimized to maintain a high coupling efficiency as the spectrally-combined, high-power beam exits the beam combiner and is coupled to a beam delivery system.

As shown, spectral beam combiner 1 is based upon the use of a multi-wavelength laser diode array 10, which comprises a plurality of separate laser diodes (either discrete devices or emitter regions within a bar structure) operating at separate and distinct wavelengths. In order to provide spectral (wavelength) beam combining, each individual wavelength needs to remain essentially "locked" onto its nominal value, since the associated diffraction grating used to perform the spectral combining (as described below) is configured in accordance with these specific wavelength values to spatially overlap the various different emitted beams onto a single spot size, thus forming a high-power output beam. For the sake of clarity, laser diode array 10 is shown as including a set of three laser diodes 10-1, 10-2, and 10-3 emitting at wavelengths $\lambda_1$, $\lambda_2$, and $\lambda_3$, respectively. It is contemplated that commercial applications of the inventive spectral beam combiner will likely use a larger number of individual laser diodes and wavelengths.

Continuing with the description of spectral beam combiner 1, the individual beams from array 10 are first directed through a beam-shaping lens assembly 12 that is used to reduce the fast-axis divergence angle and slow-axis divergence angle of each individual beam emitted by laser diode array 10. The beam-shaped output from lens assembly 12 is thereafter passed through a transformative lens 14 before reaching a diffraction grating 16. Transformative lens 14 is used to perform any wavelength-dependent beam-shaping that may be required to ensure that each beam impinges diffraction grating 16 at a unique angle of incidence (i.e., $\alpha_1$, $\alpha_2$, and $\alpha_3$) so that the plurality of separate beams (operating at the separate wavelengths $\lambda_1$, $\lambda_2$, and $\lambda_3$) may be redirected into a combined beam output.

In particular, and in accordance with the principles of the present invention, diffraction grating 16 is formed to include a particular grating pattern designed to spectrally combine the beams propagating at $\lambda_1$, $\lambda_2$, and $\lambda_3$ such that they spatially overlap at a first diffraction order (here, the +1 order) to form a single output beam O along a first path (denoted as $P_1$). As a result of the spectral beam combining, output beam O will exhibit a relatively high output power based upon the combination of the three input beams. In accordance with the principles of the present invention, diffraction grating 16 is further intentionally configured in a manner such that a residual, low-power spectrally-combined beam is created as a separate output signal at another diffraction order (here, the −1 order of diffraction grating 16). The residual, low-power spectrally-combined beam is used as a separate wavelength stabilization control beam W that is directed along a second path (denoted as $P_2$ in FIG. 1).

Said another way, diffraction grating 16 is particularly configured to direct a majority of the combined power of the different wavelength beams into a first diffraction order (here, shown as the +1 order) that forms first path $P_1$, with a secondary combined beam of limited power directed into a second diffraction order (here, shown as the −1 order) that forms second path $P_2$. Thus, in contrast to prior art spectral beam combiners that required the use of expensive high-efficiency diffraction gratings to ensure that essentially all of the spectrally-combined beam was directed into a single diffraction order, the present invention advantageously uses a diffraction grating of somewhat less complexity so that while a relatively large portion (say, 80-95%) of the spectrally-combined beam is directed into a given diffraction order, there is sufficient energy remaining in a beam directed into another order so that wavelength stabilization may be accomplished using this low power beam.

Continuing with reference to FIG. 1, spectrally-combined, high-power output beam O is shown as being directed into an output optics 18 that is used to direct the high-power beam along an output path from the beam combiner. Spectrally-combined, low-power beam W is shown as being directed into a wavelength stabilization optics 20 that is used to create an external cavity of a length sufficient to "lock" the emission wavelength of each individual laser diode 10-1, 10-2, and 10-3. Advantageously, the characteristics of output signal optics 18 may be adjusted to optimize the properties of the generated output combined beam without impacting the characteristics of wavelength stabilization optics 20, and vice versa.

Output signal optics 18 is shown in this particular example as comprising a pair of turning mirrors 22, 24 that is used here to direct the high-power spectrally-combined output beam O (presumably a free-space beam) in a preferred direction as it exits spectral beam combiner 1. By separating the wavelength stabilization functionality from the output beam path, the output path within optics 18 may be kept relatively short, which is preferred to maximize the amount of power present in the output beam.

Wavelength stabilization optics 20 is shown as including a reflector 32 for directing stabilization beam W along a path of a defined length L so as to then impinge a high-reflectivity (HR) mirror 34. The reflected beam R-W then propagates in the return direction and is used as a feedback signal in a well-known manner to maintain the individual wavelengths of laser diode array 10 "locked" at their desired values. That is, reflected beam R-W is directed toward diffraction grating 16 by reflector 32. As a result of the reciprocal nature of diffraction grating 16, spectrally-combined beam R-W will be separated into its individual wavelengths $\lambda_1$, $\lambda_2$, and $\lambda_3$, with the separate (low power) reflected beams then propagating in a reverse direction toward source 10 and utilized for wavelength stabilization in a known manner. Advantageously, the reflectivity of HR mirror 34 may be controlled to precisely adjust the amount of power that is included in reflected low-power beam R-W. While shown as a planar device in the drawings, it is to be understood that HR mirror 34 may also be slightly curved, correcting for divergence in the beam propagating along the stabilization path.

Inasmuch as only a minimal amount of power is required to provide wavelength stabilization, an advantage of the dual-path arrangement of the present invention is that the resonant power within the cavity is kept to a minimum, which means that the amount of thermal energy generated is reduced in comparison to prior art arrangements where the high-power beam destined to be the output beam is also used for wavelength stabilization. The reduction of generated thermal energy also minimizes the need to use external cooling arrangements in the inventive spectral combiner which results in a higher mechanical stability, leading to higher spectral stability and thus a longer lifetime of the diodes.

Wavelength stabilization optics 20 may also include a spatial filter 36 that is used to ensure that only the fundamental modes of the individual beams will be used for feedback purposes. As mentioned above, it is advantageous to separate out the external cavity used to provide wavelength stabilization from the output signal path, since the length of the cavity required to satisfy wavelength stability criteria is often several tens of centimeters long (with a longer path provided additional stabilization). Requiring the output signal to traverse such a long cavity will inevitably lead to a significant amount of loss in output signal power, which is obviously an undesirable attribute for high output power applications.

In comparison to prior art arrangements that desired to use a diffraction grating with an efficiency as close to 100% as possible, diffraction grating 16 of the present invention should exhibit an efficiency more on the order of 80-95%, allowing for about 5-20% of the spectrally-combined beam power to appear at another diffraction order (such as the −1 order).

It is to be understood that diffraction grating 16 may be positioned in an alternative orientation such that a majority of the optical energy is directed into the −1 diffraction order (and therefore designated as the high-power spectrally-combined output beam O provided along output signal path $P_1$), with the remaining low-energy beam W appearing in the +1 diffraction order directed along signal path $P_2$ and used to perform wavelength stabilization. Moreover, various other arrangements may be configured to use different diffraction orders, a transmissive diffraction grating or a reflective diffraction grating, a polarization-dependent grating, and the like.

Figure 2:
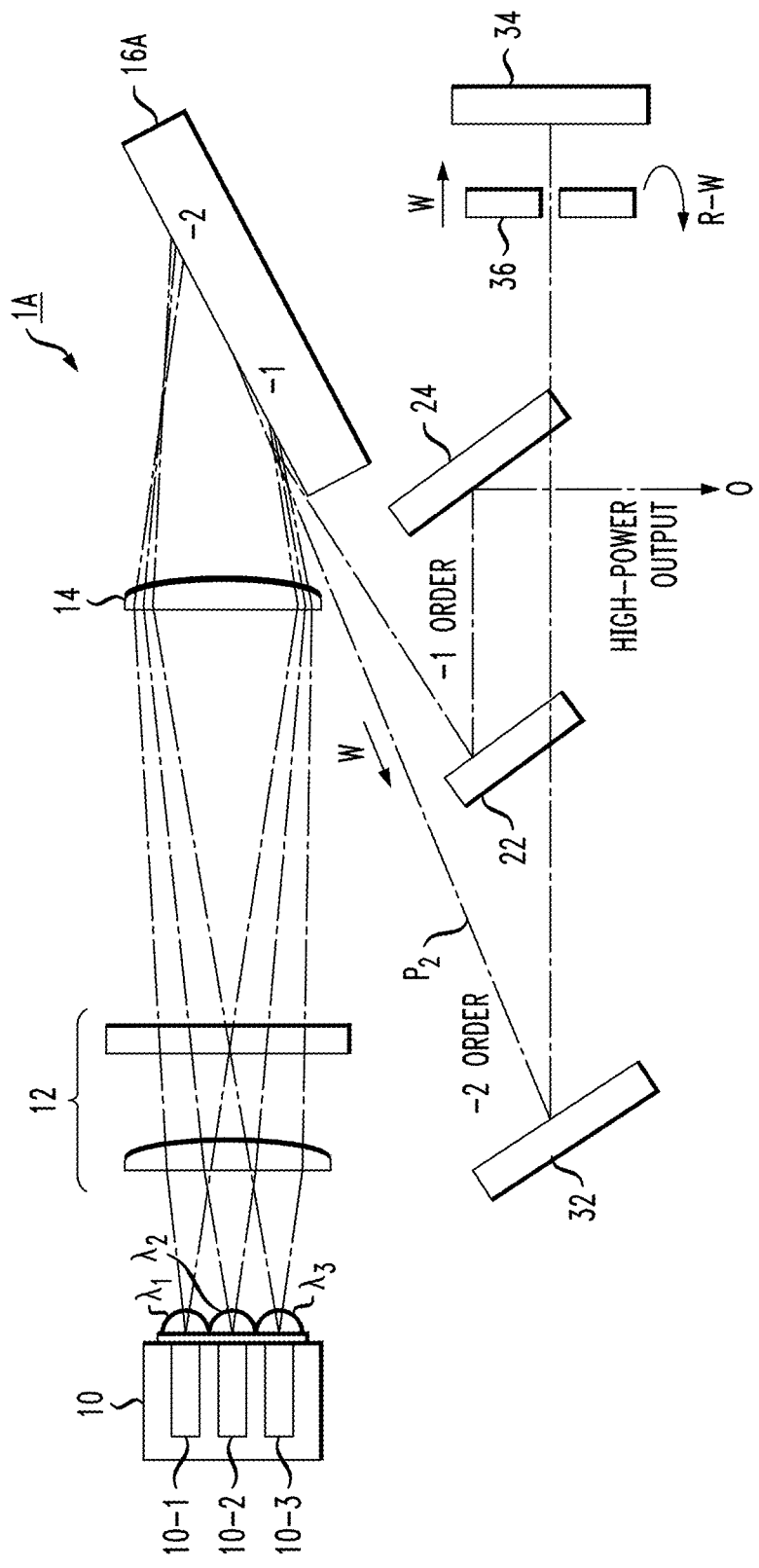
FIG. 2 is an alternative arrangement of the embodiment of FIG. 1, the specialized diffraction grating configured in this case to use a different pair of diffraction orders for the output beam and wavelength stabilization feedback beam.

FIG. 2 illustrates an alternative configuration of the embodiment of the present invention as shown in FIG. 1. Spectral beam combiner 1A is shown as comprising the same multi-wavelength, multi-beam input source 10, fast/slow divergence correction optics 12 and transformative lens 14 as utilized with spectral beam combiner 1 of FIG. 1. In this case, however, spectral beam combiner 1A utilizes a diffraction grating 16A that is configured to diffract the spectrally-combined, high-power output beam O along the −1 order of the grating, while the spectrally-combined, low-power stabilization beam W is directed along the −2 order of the grating. Here, the difference in order naturally results in the combined power appearing in the −1 order beam being significantly greater than the power appearing in the −2 order beam.

The diffraction orders utilized by grating 16A result in the two spectrally-combined beams O and W propagating in the same general direction away from diffraction grating 16A. Both output optics 18 and wavelength stabilization optics 20 may be essentially the same as the elements used in the embodiment of FIG. 1. While the two-dimensional illustration of FIG. 2 appears to indicate an "overlap" in the transmission paths, it is to be understood that in the actual three-dimensional construction, high-power output beam O and low-power wavelength stabilization beam W do not interfere with one another.

As mentioned above, inasmuch as diffraction grating 16 requires a lesser diffraction efficiency than prior art gratings used in spectral beam combiners, it is possible to use a relatively inexpensive diffraction grating for this purpose.

Inasmuch as diffraction gratings are polarization-sensitive components (while diode lasers are not purely polarized, but emit light along both the S and P orthogonal polarizations), this property of diffraction gratings may be used to create a separate wavelength stabilization feedback path in accordance with the principles of the present invention. In particular, most diode lasers transmit approximately 90-95% of their power as an S-polarized beam, with the remaining 5-10% as a P-polarized beam. This property may therefore be taken into consideration when configuring the inventive diffraction grating arrangement such that spectrally-combined S-polarized beams become the high-power output beam, with the spectrally-combined P-polarized beams utilized to perform wavelength stabilization.

Figure 3:
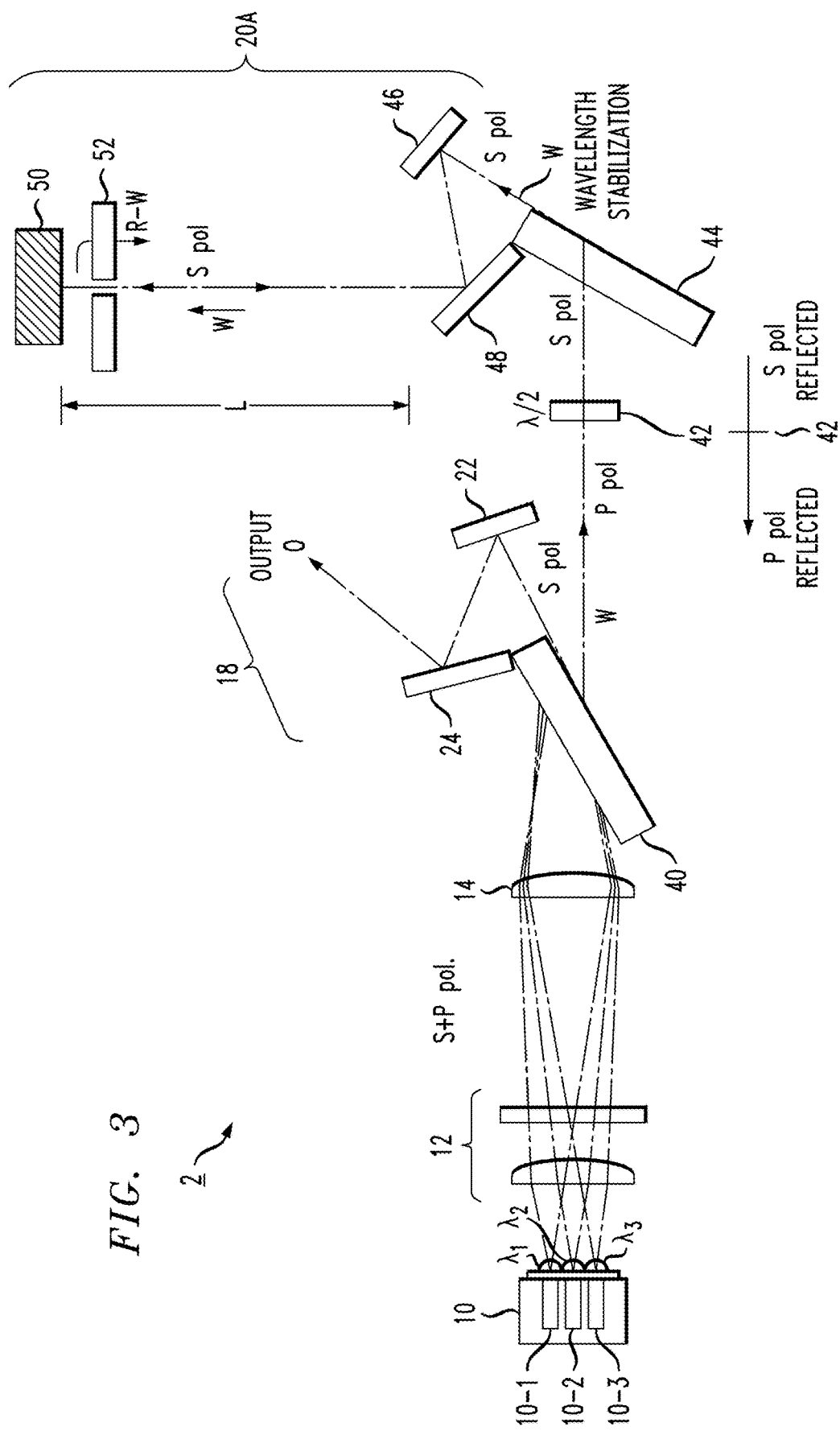
FIG. 3 is a diagram of another embodiment of the present invention, in this case using a pair of transmissive diffraction elements and polarization-based diffraction to form the separate high-power output beam and low-power wavelength stabilization feedback beam.

FIG. 3 illustrates an exemplary spectral beam combiner 2 formed in accordance with the principles of the present invention to take advantage of the polarization-dependent properties of a diffraction grating. As discussed in detail below, spectral beam combiner 2 functions in a manner that allows for separate, independent paths for each polarization state of a diffracted beam, a first polarization state thereafter associated with spectrally-combined, high-power output beam O and a second polarization state thereafter associated with spectrally-combined, low-power wavelength stabilization beam W. As shown, spectral beam combiner 2 of FIG. 3 is based upon a similar laser diode array 10, beam-shaping lens assembly 12 and transformative lens 14 as used in the embodiments shown in FIGS. 1 and 2. For explanatory purposes, these individual beams exiting laser diode array 10 are identified as having "S+P" polarization, meaning optical energy is present along each polarization direction at these beams propagate through lenses 12 and 14.

Spectral beam combiner 2 is shown as including a first transmissive diffraction grating 40, where in accordance with this embodiment of present invention the polarization-dependent properties of first transmissive diffraction grating 40 are used to separately operate on each polarization state of the plurality of beams that reach grating 40 from laser diode array 10. For the purposes of explanation, it is presumed that the grating structure of first transmissive diffraction grating 40 is configured such that S-polarized components of all of the beam (i.e., the components having 90-95% of the total optical power of each beam) is diffracted into a common diffraction order, providing the spectrally-combined, high-power output beam O. Output optics 18 (or any other appropriate combination of beam-turning elements) may be used to direct spectrally-combined, high-power output beam O along a defined output path from spectral beam combiner 2.

In accordance with the properties of a transmissive diffraction grating, while the S-polarized components of the beams are diffracted by grating 40, the P-polarized components will pass through unaffected. That is, the P-polarized beams remain in their individual form, virtually "transparent" to the presence of first transmissive diffraction grating 40. A half-wave plate 42 is shown as disposed along the path of the P-polarized beams beyond first transmissive diffraction grating 40 and functions to rotate the beams to now exhibit the S polarization state. A second transmissive diffraction grating 44, identical in form and function to first transmissive diffraction grating 40, is positioned beyond half-wave plate 42 so as to intercept the now S-polarized, low-power beam components. As shown, these S-polarized low-power components are diffracted in the same manner as the high-power beam components are diffracted by first transmissive diffraction grating 40, forming low-power spectrally-combined wavelength stabilization beam W. Wavelength stabilization optics 20A is shown in this configuration as comprising a pair of turning mirrors 46, 48 that is used in combination with a spaced-apart HR mirror 50 to create the resonant path length L required to provide wavelength stabilization in the manner described above. As before, a spatial filter 52 may be included to ensure that only the propagating fundamental mode is used to perform wavelength stabilization.

In the embodiment as shown in FIG. 3, a reflected beam R-W within wavelength stabilization optics 20A remains as an S-polarized beam as it is re-directed into second transmissive diffraction grating 44. Therefore, grating 44 functions in accordance with its reciprocal nature to separate out (diffract) the individual wavelength beams (while retaining their S polarization state). A return trip through half-wave plate 42 re-orients the individual beams into P-polarized components, allowing them to pass through first transmissive diffraction grating 40 unaffected and perform wavelength stabilization in a conventional manner.

As an alternative to using a half-wave plate, second diffraction grating 44 itself may be rotated 90° (or through any other angle associated with providing a desired amount of power in the wavelength stabilization beam).

Figure 4:
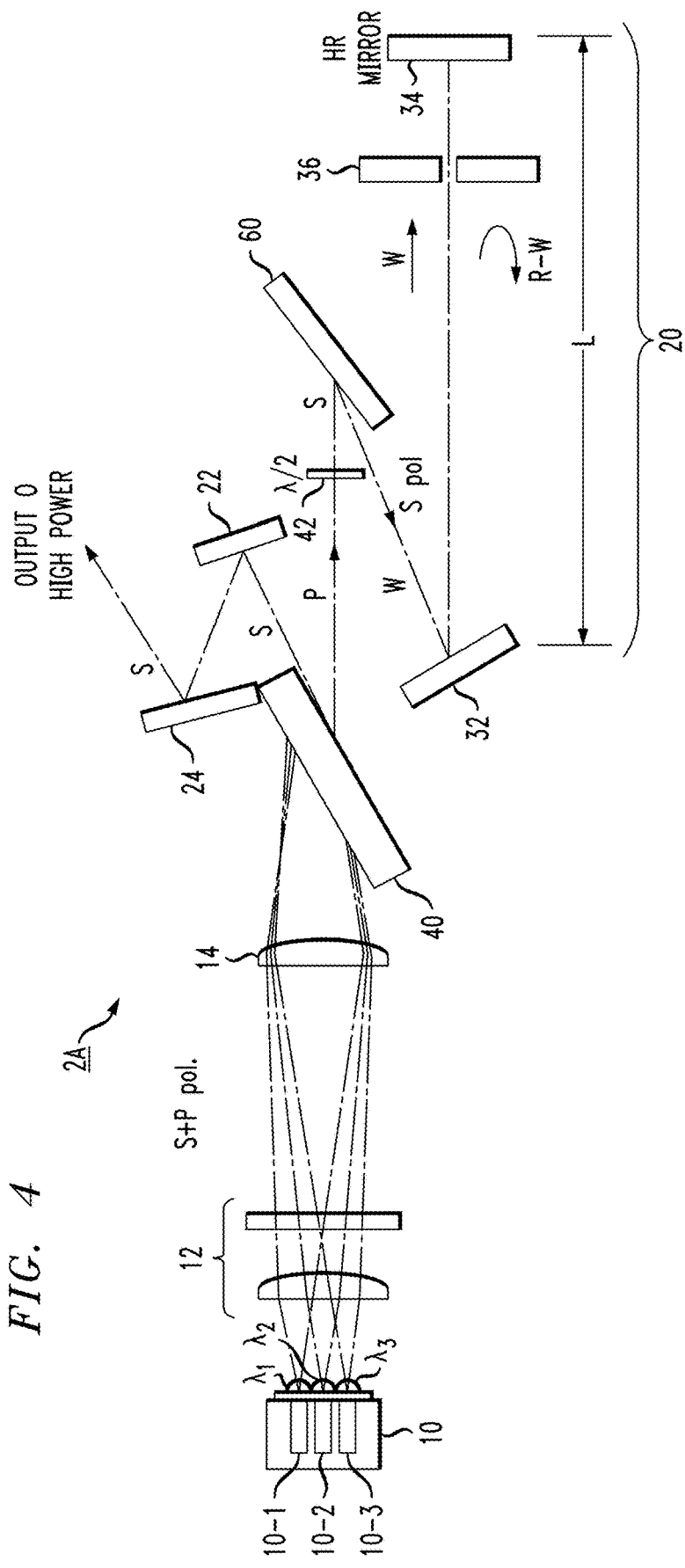
FIG. 4 is an alternative arrangement of the embodiment of FIG. 3, in this case using a combination of a transmissive diffraction element and reflective diffraction element.

FIG. 4 illustrates an alternative embodiment of a polarization-dependent spectral combiner 2A. Similar to the arrangement of FIG. 3, a transmissive diffraction grating is utilized as first diffraction grating 40, providing a spectrally-combined, high-power output of the S-polarized components of the individual beams. Similarly, the P-polarized components pass through first diffraction grating 40 essentially unimpeded, and are again rotated by half-wave plate 42 to become S-polarized (low power) beam components. However, instead of using a second transmissive diffraction grating, the embodiment of the present invention as shown in FIG. 4 utilizes a reflective diffraction grating 60 as a second diffraction grating. In accordance with the principles of present invention, the grating structure of reflective diffraction grating 60 is configured to reflect and re-direct the S-polarized beams into a given diffraction order as the spectrally-combined, low-power wavelength stabilization beam W. In the particular arrangement as shown in FIG. 4, spectrally-combined, low-power beam W is directed into similar wavelength stabilization optics 20 as discussed above. The presence of half-wave plate 42 ensures that the reflected stabilization beam R-W is configured into a set of P-polarized beams of each wavelength prior to passing through transmissive diffraction grating 40.

Figure 5:
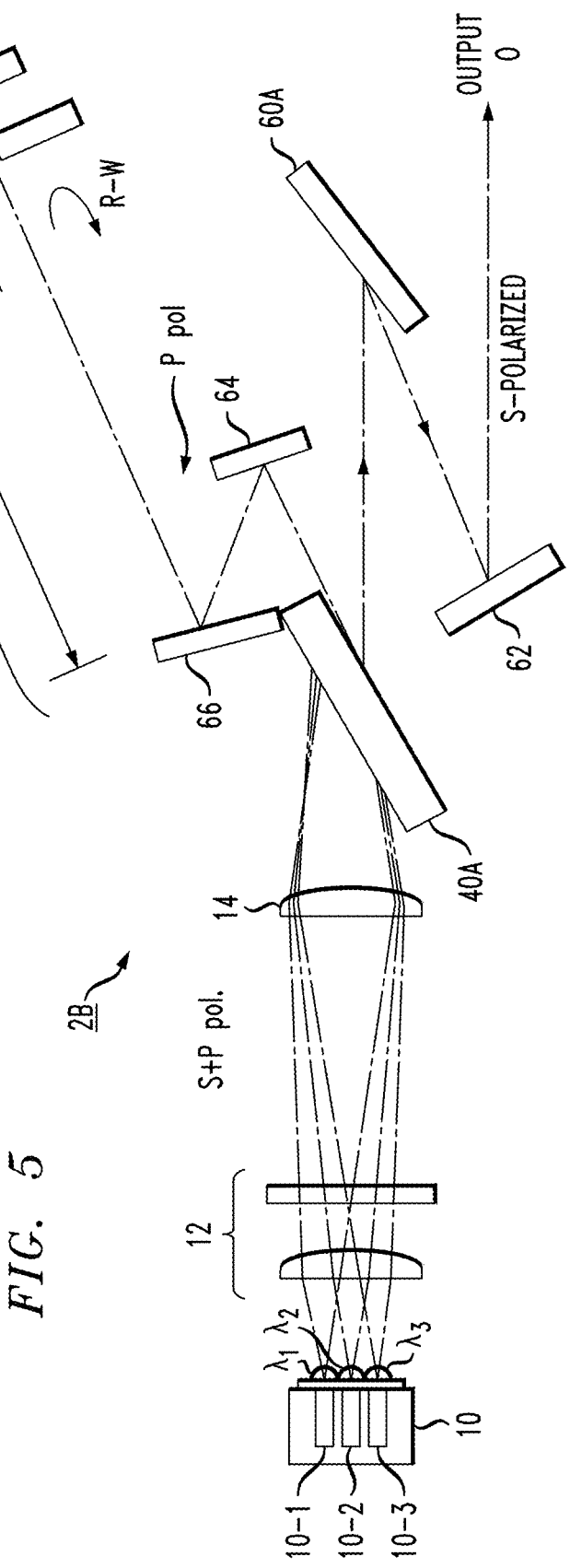
FIG. 5 is a diagram of yet another embodiment of the present invention, also using a pair of diffraction elements, the first diffraction element being a transmissive element configured to create the spectrally-combined, low-power wavelength stabilization feedback beam, and the second diffraction element being a reflective diffraction grating for creating the spectrally-combined, high-power output beam.

Inasmuch as a reflective diffraction grating is known to be more power efficient than a transmissive diffraction grating, it is possible to re-orient gratings 40 and 60 of the arrangement of FIG. 4 to take advantage of this feature. FIG. 5 illustrates an exemplary polarization-based spectral beam combiner 2B based on this approach.

Spectral beam combiner 2B as shown in FIG. 5 includes a transmissive diffraction grating 40A that is formed to diffract the low-power P-polarized components of the individual laser beams into the same diffraction order (for example the +1 order), and allow the high-power S-polarized components of these laser beams to pass through unimpeded. A reflective diffraction grating 60A is positioned to receive these high-power individual beams and diffract them into a common diffraction order (for example, the −1 order), providing a spectrally-combined high-power output beam O in the same manner as discussed above. Additional turning mirrors (such as mirror 62 shown in FIG. 5) may be used to direct the high-power beam O along the defined output path from spectral beam combiner 2B.

Low-power spectrally-combined wavelength stabilization beam is shown as directed by a pair of turning mirrors 64, 66 along a wavelength stabilization path of length L. As with the wavelength stabilization optics discussed above, an HR mirror element 68 is used to re-direct the low-power beam back into transmissive diffraction grating 40A, providing feedback to stabilize the operating wavelengths of laser diodes 10-1, 10-2, and 10-3.

It is thought that the arrangement of FIG. 5 may be more efficient than spectral beam combiner 2A of FIG. 4 in terms of provided output power, as well as exhibiting fewer issues with respect to thermal management, by virtue of using a reflective type of grating to create the spectrally-combined, high-power output.

While the principles of the present invention have been particularly shown and described with respect to illustrative and preferred embodiments, it will be understood by those skilled in the art that the foregoing and other changes in form and details may be made therein without departing from the spirit and scope of the invention, which should be limited only by the scope of the claims appended hereto.

What is claimed is:

1. A spectral beam combiner comprising:
    a plurality of individual laser beam sources, each emitting a beam at a different wavelength to create a plurality of laser beams;
    a diffraction grating disposed to intercept the plurality of laser beams, the diffraction grating configured to direct a majority of the optical power of each beam into a defined first diffraction order to form a spectrally-combined, high-power optical output and direct a residual optical power of each beam into a defined second diffraction order to form a spectrally-combined, low-power beam; and
    wavelength stabilization optics disposed to intercept the spectrally-combined, low-power beam, the wavelength stabilization optics including
        a turning mirror positioned to intercept spectrally-combined, low-power beam and re-direct the low-power beam along a stabilization path; and
        a high-reflectivity (HR) mirror disposed along the stabilization path at a spaced-apart distance L from the turning mirror, the spaced-apart distance L selected to form a resonant cavity with the plurality of individual laser beam sources and provide wavelength stability for the plurality of laser beams.

2. The spectral beam combiner as defined in claim 1 wherein the spectral beam combiner further comprises
    a spatial beam filter disposed along the stabilization path to block propagation of higher-order modes along the wavelength stabilization path.

3. The spectral beam combiner as defined in claim 1 wherein the HR mirror is shaped to correct for divergence of the propagating spectrally-combined, low-power beam.

4. The spectral beam combiner as defined in claim 1 wherein a reflectivity percentage of the HR mirror is controlled to adjust an output of power present within the resonant cavity providing wavelength stabilization.

5. The spectral beam combiner as defined in claim 1 wherein the spectral beam combiner further comprises
    a lensing system disposed between the plurality of individual laser beam sources and the diffraction grating, the lensing system including a fast-axis lens and a slow-axis lens to provide beam shaping and minimize divergence along each axis.

6. The spectral beam combiner as defined in claim 1 wherein the spectral beam combiner further comprises
    a transformative lens element disposed between the plurality of individual laser beam sources and the diffractive grating, the transformation lens element configured to provide a spatial separation between each beam wavelength on a surface of the diffraction grating by directing each beam to arrive at a unique angle of incidence.

7. The spectral beam combiner as defined in claim 1 wherein the diffraction grating comprises a transmissive grating.

8. The spectral beam combiner as defined in claim 1 wherein the diffraction grating comprises a reflective grating.

9. The spectral beam combiner as defined in claim 1 wherein the diffraction grating comprises a pair of diffraction grating elements coaxially disposed along an optical beam path, the pair of diffraction grating elements configured to perform polarization-dependent diffraction on the plurality of individual laser beams, each laser beam defined as including a high-power component along a first polarization state and a low-power component along a second, orthogonal polarization state.

10. The spectral beam combiner as defined in claim 9 wherein the pair of diffraction grating elements comprises a first transmissive diffraction grating element.

11. The spectral beam combiner as defined in claim 10 wherein the first transmissive diffraction grating element is configured to diffract the high-power components along the first polarization state into a diffraction order forming the spectrally-combined, high-power output beam, with the low-power components passing through the first transmissive diffraction grating element unimpeded.

12. The spectral beam combiner as defined in claim 11 wherein the pair of diffraction grating elements further comprises a second transmissive diffraction grating element, and the spectral beam combiner further comprises a half-wave plate disposed between the first transmissive diffraction grating element and the second transmissive diffraction grating element, the low-power components thus rotated into the first polarization state by the half-wave plate and diffracted by the second transmissive diffraction grating element along a common diffraction order to form the spectrally-combined, low-power beam applied as an input to the wavelength stabilization optics.

13. The spectral beam combiner as defined in claim 11 wherein the pair of diffraction grating elements further comprises a reflective diffraction grating element, and the spectral beam combiner further comprises a half-wave plate disposed between the first transmissive diffraction grating element and the reflective diffraction grating element, the low-power components thus rotated into the first polarization state by the half-wave plate and diffracted by the reflective diffraction grating element along a common diffraction order to form the spectrally-combined, low-power beam applied as an input to the wavelength stabilization optics.

14. The spectral beam combiner as defined in claim 10 wherein
- the first transmissive diffraction grating element is configured to diffract the low-power components along the second polarization state into a common stabilization diffraction order forming the spectrally-combined, low-power beam, with the high-power components passing through the first transmissive diffraction grating element unimpeded; and
- a second diffraction grating element of the pair of diffraction grating elements is configured to diffract the high-power beams into a common output diffraction order, forming the spectrally-combined, high-power output beam.

* * * * *